SERIES CONNECTED TOTEM-TRIODE AMPLIFIERS

Filed April 20, 1951 3 Sheets-Sheet 1

INVENTORS
John C. Achenbach
& Simeon I. Tourshou
BY
ATTORNEY

INVENTORS
John C. Achenbach
& Simeon I. Tourshou
BY [signature]
ATTORNEY

June 12, 1956 J. C. ACHENBACH ET AL 2,750,450

SERIES CONNECTED TOTEM-TRIODE AMPLIFIERS

Filed April 20, 1951 3 Sheets-Sheet 3

INVENTORS
John C. Achenbach
& Simeon I. Tourshou
BY [signature]
ATTORNEY

United States Patent Office 2,750,450

Patented June 12, 1956

2,750,450

SERIES CONNECTED TOTEM-TRIODE AMPLIFIERS

John C. Achenbach, Haddonfield, N. J., and Simeon I. Tourshou, Philadelphia, Pa., assignors to Radio Corporation of America, a corporation of Delaware Application April 20, 1951, Serial No. 222,132

1 Claim. (Cl. 179—171)

This invention relates in general to amplifier circuits, and more particularly to series connected wide-band amplifiers for multi-channel operation over a wide range of high frequencies such as may be employed in the radio-frequency amplifier circuits of television receivers. Still more particularly, this invention relates to a biasing control circuit for wideband amplifiers for providing control of the cut-off characteristic of the amplifier.

In tuned radio-frequency amplifier circuits pentode amplifier tubes are preferred over triode amplifier tubes because of their stability and gain. However, due to the fact that the noise characteristic of a pentode amplifier is inherently greater than that of a triode amplifier, a poorer signal-to-noise ratio results. Therefore, at frequencies of operation where tube noise becomes an important factor, such as in a television receiver, it is preferable to have an amplifier with the gain and stability of a pentode amplifier, and with the signal-to-noise ratio of the triode amplifier.

For operation at the high frequencies encountered in television receivers, neutralization is required for conventional grounded-cathode triode amplifiers when working the plate into a high impedance circuit. Signal voltage feedback from the plate to the grid results due to the grid-plate interelectrode capacity. Also, it has been desirable to neutralize to improve the signal-to-noise ratio. Improved operation would result, however, if a triode amplifier circuit were provided which did not require neutralization, which necessitates the provision of additional tuned neutralizing circuits. Improved operation in part results in a simplified circuit because of the tendency of the additionally required component parts in a neutralized circuit to resonate with stray inductances or capacities and cause spurious responses, absorption of signal, or feedback resulting in unpredictable amplifier characteristics. Furthermore, the added expense of extra component parts is objectionable, particularly if comparable signal-to-noise characteristics and feedback operation may be accomplished in the absence of the more complicated circuits. In tunable or multi-channel amplifier circuits, neutralizing circuits are not in general effective without involving expensive variably tunable circuits, which cannot generally be precisely provided under mass-production assembly of commercial receivers.

In accordance with the copending P. C. Swierczak application, Ser. No. 219,263, filed April 4, 1951, there is provided a similar improved amplifier circuit comprising a pair of tubes includes a grounded-cathode input stage including a low noise triode for driving a grounded-grid driven amplifier stage. The coupling means between the stages is constituted by an inductance and capacitance connected from the plate of the driving tube to ground to present a circuit series resonant at a frequency within or near the pass-band of the amplifier. This results in a low plate-to-ground signal impedance on the driving tube so that there is essentially no signal feedback from the plate to the grid, and neutralization is therefore not necessary. In addition, the cathode input signal of the grounded-grid stage is developed across the capacitance branch of the resonant circuit, and the resonant circuit signal gain helps to develop a relatively high signal potential, thus increasing the gain of the amplifier and thereby effecting improved signal-to-noise characteristics.

In accordance with one phase of the invention described in the above-identified copending application of P. C. Swierczak, a pair of amplifier tubes with series direct-current paths is provided in which the coupling means is constituted by a circuit series resonant at a frequency in or near the pass-band of the amplifier and does not require a change in tuning when input and output circuits of the amplifier tubes are tuned throughout a wide band of frequencies.

By providing series direct current paths for a pair of amplifier tubes, coupling circuit connections are further simplified by elimination of isolation or decoupling components, and high frequency operation is further improved by decreased radio-frequency losses, along with the aforementioned preclusion of spurious responses. In circuits employing series-connected tubes however a critical balance between the tubes must be initially provided and maintained throughout wide ranges of signal amplitude to afford maximum effective gain.

In addition, when automatic gain control (A. G. C.) voltage is used to bias such circuits, it is desirable to have a somewhat sharp cut-off characteristic to provide the most effective operation without amplification of the bias voltage generally available. Conversely, however, if too sharp a cut-off characteristic is provided, the non-linear portions of the characteristic curves result in cross-modulation, not tolerable in radio-frequency amplifier circuits where good signal-to-noise ratios are desirable.

In accordance with the present invention a biasing control circuit is provided for series connected tubes to enable a modified remote cut-off characteristic and balanced tube impedances. A fixed biasing circuit is provided in connection with the high voltage series tube which comprises a source of uni-directional potential and a voltage dividing network including the low voltage series tube. When the A. G. C. voltage which is applied to the low voltage series tube is increased, the plate voltage of that tube also tends to increase thus tending to maintain the current flow therethrough. The increase in plate voltage of the low potential series connected tube causes a redistribution of potential across the voltage divider network which is reflected through a direct current connection to the control electrode of the high voltage series tube in a direction which tends to increase the plate voltage of that tube.

A general object of the invention is to provide improved and simplified wide-band amplifier circuits for use at high frequencies generally employed in the tunable radio-frequency sections of television receivers, but not limited thereto.

Another object of the invention is to provide wide-band amplifier circuits for providing control of the cut-off characteristic of a pair of series connected tubes.

A further object of the invention is to provide stable wide-band tunable amplifier circuits for maintaining a substantially constant impedance balance of series connected tubes for large variations in signal gain.

A more specific object of the invention is to provide circuits employing series-connected tubes in which tube balance is automatically established and maintained over wide variations of tube and signal parameters, and in which cut-off characteristics may be simultaneously afforded for optimum operation of the circuit when used in radio-frequency amplifiers.

Features characteristic of the invention which are believed novel are set forth with particularity in the appended claim. The invention itself, however, both as to its organization and mode of operation together with further objects and advantages thereof, will best be understood by reference to the following description when considered in connection with the accompanying drawings, in which:

Figure 1:
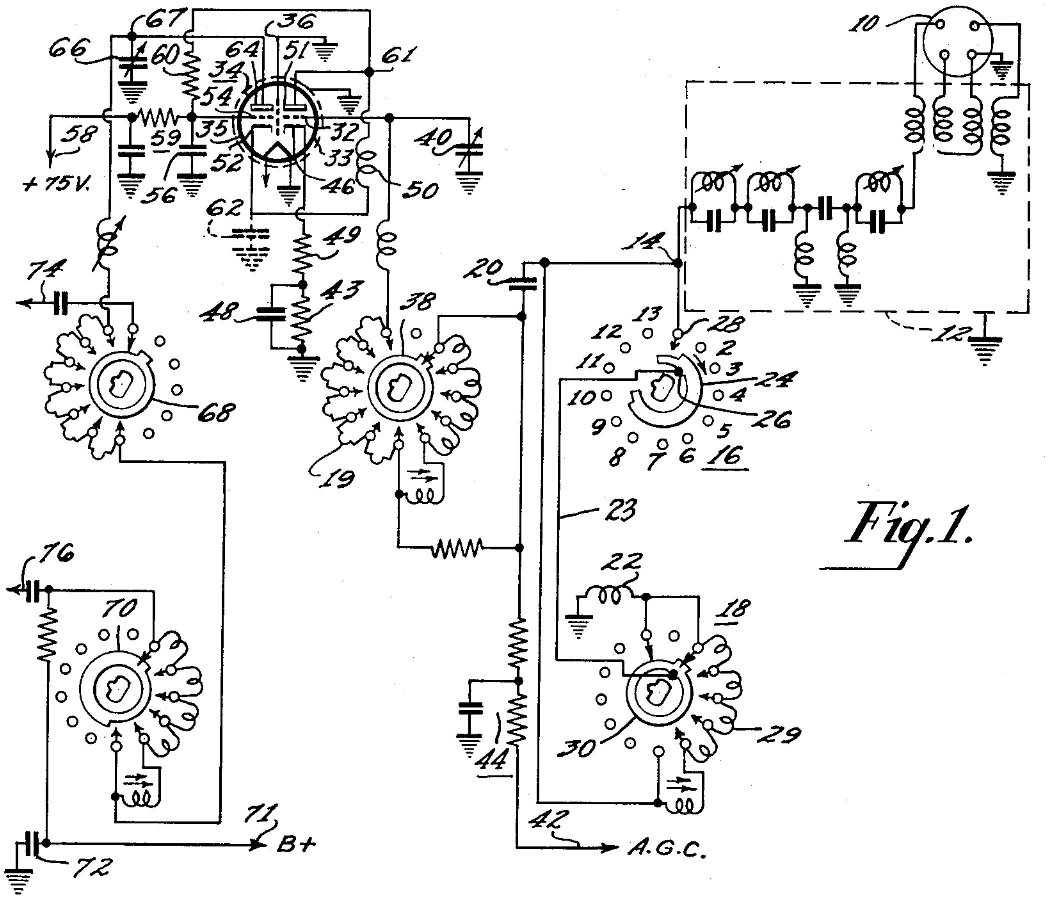
Figure 1 is a schematic circuit diagram of a tunable radio-frequency amplifier circuit for television receivers embodying the invention.
Figure 2:
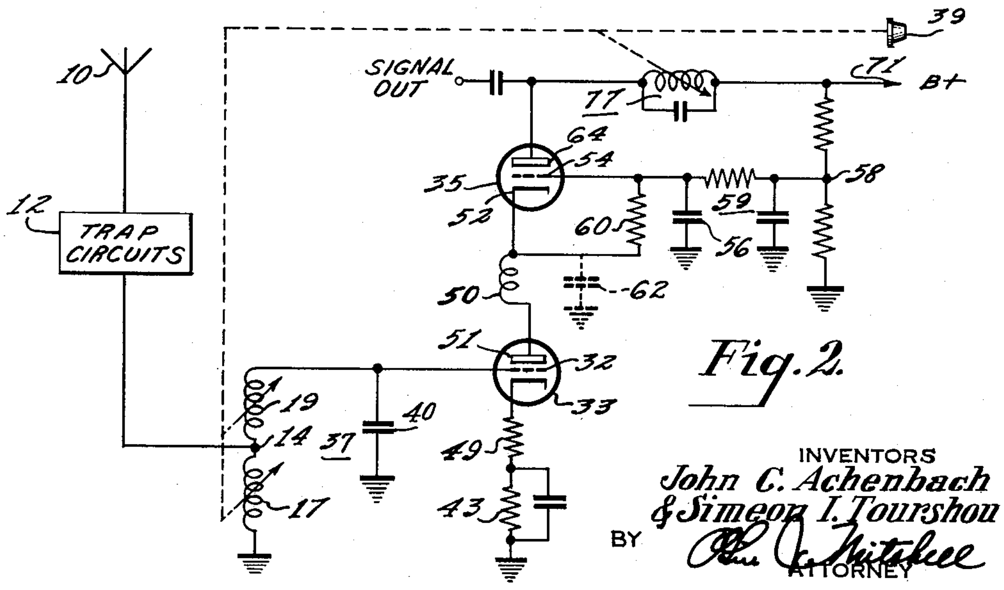
Figures 2 to 6 are schematic circuit diagrams illustrating various modifications of grounded-grid driven amplifier circuits constructed in accordance with the invention.

Throughout the respective figures of the drawing, like reference numerals designate like circuit components. Referring now in particular to Figures 1 and 2, there is schematically illustrated a radio-frequency amplifier circuit for television receivers, or the like, which derives input signals from an antenna, or other signal source, connected to the input terminal board 10. Input signals are passed through a matching transformer and suitable traps or interference attenuation circuits found within the shielded compartment 12.

Thus, filtered input signals arriving at terminal 14 feed into the impedance matching networks 16 and 18 at switch sections 24 and 30. The switch sections 24 and 30 effect an essentially constant input impedance at the blocking capacitor 20 throughout each of the television channels. The high-frequency impedance network 16 is presented between terminal 14 and ground by way of the lead 23 and inductance 22. At the high-frequency television channels 7 through 13 the inductance is varied by the inherent inductance of the switch rotor sections 26 and 30 mainly presented for different bands by the portion of switch section 24 between the coupling connection 26 and the switch contact 28. This impedance is sufficiently low that for channels 7 through 13 it constitutes essentially the entire input inductance, even though the low frequency network 18 is connected in shunt therewith, because the network 18 has a much higher relative impedance.

For the lower frequency channels 2 through 6 the high frequency impedance network 16 is not connected in circuit, however, and the overall impedance is determined by the number of series inductors 29 connected in the low frequency network 18 by the switch section 30. Throughout the discussion of this figure it is to be recognized that each of the switch sections is ganged for unicontrol operation throughout the television channels 2 to 13, and the contact elements rotate in a clockwise direction as indicated in connection with the arrow at the first mentioned switch section 24.

The input blocking capacitor 20 thus presents a signal input voltage at switch section 38, which operates to step the input circuit impedance up to match the input impedance of a succeeding amplifier tube 34 at the grid 32 of the first triode section 33 thereof. This tube 34 is preferably a double-triode tube having an internal shield 36, thus as a 6BQ7, but is not necessarily limited thereto. The signal input voltage is therefore tapped across a tuned input circuit comprising capacitor 40 and a pair of variable inductances respectively being inductance 19 presented by switch section 38, and the inductance from terminal 14 to ground, comprising the inductance of the impedance matching networks 16 and 18 of Figure 1 correspondingly shown in more simplified form 17 in Figure 2.

An automatic gain control bias voltage is series connected to the grid 32 from terminal 42 by way of the decoupling circuit 44 and the variable inductor 19 located about switch section 38. The cathode 46 and the first section of the twin triode of the tube 34 provide some additional bias developed across bypassed resistor 43. The cathode 46 is essentially grounded for signal frequencies by capacitor 48, since unbypassed resistor 49 is small. A slight amount of degeneration is developed at the resistor 49 to maintain a more constant input capacity with any change in bias of the amplifier circuit.

Coupling is provided between the triode sections solely by the inductor 50, which is of the order of .15 microhenrys, and is connected between the plate 51 of the first triode section 33 and the cathode 52 of the second triode section 35. This inductor 50 series resonates with a capacitance 62 of about 5 micro-microfarads, presented between the cathode 52 of the second section and ground, at a frequency to provide a low impedance at a frequency within the signal pass-band characteristic of the amplifier circuit. For television receivers adapted to the present United States standards, resonance preferably occurs near the center channel of the high frequency band including channels (7–13). The series resonant circuit is effective throughout a rather broad band of frequencies including the high band channels 7 to 13 because of the loading presented by the inherently low input resistance of the second triode section.

The grid 54 of the second triode section 35 is maintained at signal ground by capacitor 56. Grid bias is obtained for the second triode section 35 at terminal 58 from a positive potential source of an amplitude in the order of half the anode supply voltage of the tube 34, or about the potential which appears at the anode 51 of the first triode section 33. A resistance-capacitance decoupling circuit 59 is provided to prevent voltage variations or signal voltage components in the positive potential supply source from effecting variations upon the grid 54. A grid return resistor 60 connects the grid 54 of the second triode section 35 effectively to its cathode 52 at the anode terminal 61 of the first triode section 33, since the inductor 50 has negligible impedance for direct current voltages. This connection may be made at the cathode 52 if desired. However, for operation at high frequencies, output to input stray coupling must be kept as low as possible, and the most convenient circuit connection should be chosen to provide best overall operation. Further explanation of the biasing circuit will be made hereinafter in connection with the circuit of Figure 9.

The second triode section 35 of tube 34 comprises a grounded-grid cathode-input section. Its input impedance comprises the cathode-to-ground capacity 62 and the input resistance of the tube. It will be recognized therefore that the only circuit component necessary to couple the stages is the small inductor 50. This provides very stable operation of the amplifier at high frequencies, because additional components may develop spurious resonances and/or feedback conditions. Such a circuit is further highly desirable because of its economy. As will be shown in more detail hereinafter, the present circuit, in spite of its simplicity, functions to provide better performance than prior circuits of a more complicated nature.

A tuned output circuit is coupled to the anode 64 of the second triode section 35, constituting the capacitor 66 and the inductance from terminal 67 to ground as presented by the switch sections 68 and 70. Because the anode B+ supply is coupled to the tube 34 through the plate inductance from the terminal 71, the capacitor 72 is provided to establish signal reference potential or ground at the lower end of the plate inductance. For better operation over the entire spectrum represented by television channels 2 to 13, a pair of output terminals 74 and 76 is provided. The lower frequency band output signal for channels 2 to 6 is therefore taken from terminal 76, and the higher band signal from channels 7 to 13 from terminal 74.

To better illustrate certain advantages of the above-described amplifier, the circuit of Figure 1 is shown in a more simplified form in Figure 2. In this circuit, it is clearly shown that the variable input inductors 17 and 19 are mechanically coupled by the control linkage means 39 to the tuned circuit 77 to provide optimum performance for each band of operation throughout the tuning range of the tuned input and output circuits 37 and 77. Series connected direct current paths are provided for the two discharge paths comprising triode sections 33 and 35, which may be separate tubes if desired. Thus, the B+ voltage applied at terminal 71 is connected to the plate of anode 64 of the second triode section 35, and both triode sections 33 and 35 have a common direct current path by means of the coupling inductor 50. Because of this series direct current path, the amplifier may be descriptively called a "totem" amplifier, or more specifically a totem-triode amplifier. This circuit arrangement more forcefully illustrates the simplicity of the interstage coupling circuit which constitutes solely the inductor 50, when the frequencies are in the order of those used in the presently assigned television channels where the cathode-to-ground capacitance 62 of the triode section 35 may be used. At other frequencies or with other tube parameters and conditions some added external capacity may be used.

Figure 3:
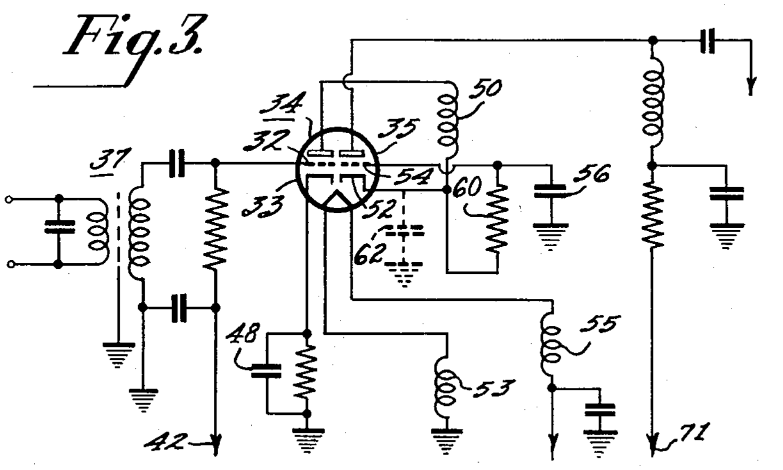

Grid-leak bias may be used in the second triode section 35 rather than bias from the positive potential terminal 58, if desired, as shown in Figure 3. This circuit, which likewise is provided for tuning over a wide band of frequencies such as those encountered in television receivers, has the second triode section 35 biased by a grid leak resistor 60 and a shunted capacitor 56, which additionally establishes the grid 54 at the signal reference potential. In this embodiment, operation over the high frequencies bands is substantially identical to that hereinbefore explained.

Because of the chokes 53 and 55, which may be provided, if desired, in the heater circuit of the tube 34, the cathode-to-ground capacitance 62 will essentially comprise the cathode-to-grid capacity of the triode section 35 together with the combination of the cathode-to-heater capacitance of the triode section 35 and the heater-to-cathode capacitance of the triode section 33. When a grounded shield is used, as found in a tube of the type 6BQ7 hereinbefore mentioned, the cathode-to-shield capacity must also be considered. These capacities and other tube parameters are well known to those skilled in the art, however, and from the teachings of this invention the coupling circuit may be designed to operate properly within the desired frequency pass-bands of a wide band amplifier.

Figure 4:
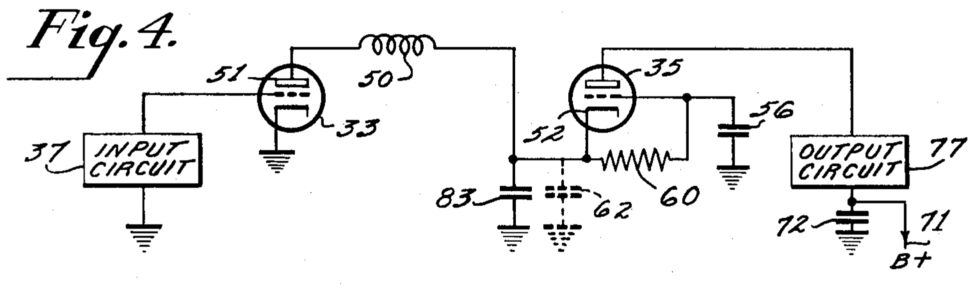

Further simplification of the totem-triode amplifier of this invention is shown schematically in Figure 4, wherein the capacitor 62 may be supplemented by an additional shunting capacitor 83 to provide operation at lower frequencies than otherwise possible or with tubes of the type wherein the cathode-to-ground capacity is not sufficient to provide the required input impedance characteristics for the triode section 35. The coupling circuit, connecting the anode 51 of the first triode section 33 to the cathode 52 of the second triode section 35 with a combined direct current and signal transfer path, consists solely of inductor 50. The bandpass characteristic of the amplifier is not normally determined by the series resonant circuit including the capacitance of shunted capacitors 62 and 83 and the inductance of the inductor 50 since this circuit has a fairly broad bandpass characteristic. Throughout the response characteristic of the tuned input and output circuits therefore the signal voltage at the plate 51 of the input triode section 33 will be small, and neutralization is therefore not required. In addition the signal voltage at the cathode 52 is increased since it utilizes the gain of the series resonant circuit.

It is to be noted that the combined capacitance of the shunt connector capacitors 83 and 62 should be greater than the grid-to-plate capacitance of the triode section 33, which is normally of the order of 1.5 micro-microfarads for a triode. This precludes any possibility for the inductor 50 to comprise a series resonant circuit with the grid-to-plate interelectrode capacity of the tube 33 from the cathode 52 to ground within the signal bandpass characteristic of the amplifier. If this should happen, a high amplitude feedback signal would result and neutralization would be necessary to secure proper amplification.

In the foregoing discussion it has been theoretically assumed that the input impedance of the top triode of the totem amplifier is very high and is essentially pure capacitive reactance. This relationship is only approximate because of the input resistance of the tube, but is sufficient to consider for purposes of explaining the present conception of the operation of the invention. For a consideration of the theoretical analysis and development of a series resonant coupling circuit taking into account other factors, United States Patent 1,987,687, issued to Landon et al., January 15, 1935, may be referred to. It is noted in contrast to the Landon circuit that the present amplifier circuit utilizes in general not only a variably tuned circuit but an entirely different coupling arrangement for the electron tube signal and direct current transfer paths. These differences become important at high frequencies and in radio-frequency amplifiers because of the simplicity of circuit coupling and the improved signal-to-noise ratio thereby possible. The present preferred embodiment is directed toward a low-noise amplifier having low signal impedance at the anode of the first triode section, and coupled to provide high signal gains throughout the pass-band range of a tunable amplifier circuit.

Figure 5:
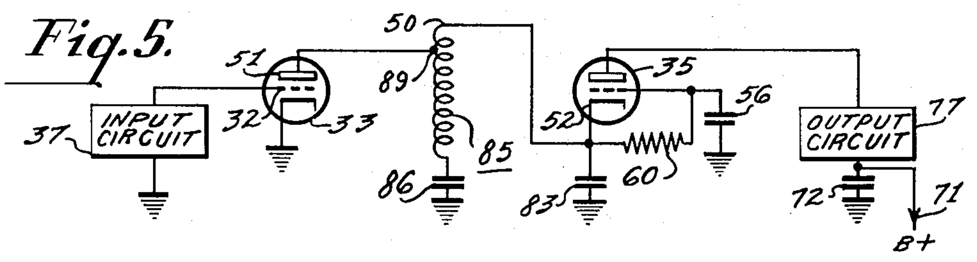

Although there have been described hereinbefore certain of the preferred embodiments of the high frequency amplifier, it is not restricted solely to the type circuit before described, but may be incorporated in such embodiments as that shown in Figure 5. This circuit is substantially identical with the circuit of Figure 4, except for the signal transfer circuit coupling the triode amplifier sections 33 and 35. A tapped inductor or auto transformer 85 is provided having the anode 51 of the first triode section 33 connected to the inductor tap 89. For series-connected direct current paths of the tubes, a direct current isolating capacitor 86 couples the low potential end of inductor 85 to the signal reference potential point. There is thus provided an output impedance for the first triode section 33 which is connected from the tapped portion of the inductor to ground by way of the capacitor 86.

The interstage coupling circuit comprises the direct circuit connection from the anode 51 through the high signal potential end of the inductor to the cathode 52 of the second triode section 35. This permits the portion of the inductor 50 between the tap 89 and the cathode 52 to series resonate with the capacitor 83 between the cathode 52 and ground in the manner hereinbefore described. The lower portion of the auto transformer 85 because of a relatively higher impedance does not have appreciable effect at the higher frequency end of the signal passband of the amplifier. However, the auto transformer winding 85 may resonate with the capacitor 83 at the lower end of the frequency band to provide a parallel resonant circuit presenting a high amplitude signal voltage to the cathode 52 of the second triode section 35. The lower section of the transformer 85 will provide improved operation of the amplifier at frequencies lower than that of parallel resonance by presenting a more constant impedance load circuit for the tube 33 when the impedance of capacitor 83 becomes very large. The resonant peak of this circuit when tuned is therefore preferably provided at the upper portion of the lower frequency band, which may include television channels 2 to 6 for example.

Because of the auto transformer effect plate 51 is tapped down on inductor 85 somewhat, thus establishing the plate signal potential lower than otherwise could be obtained with a parallel resonant cathode input network for a driven amplifier section 35 of the totem triode circuit. This effect is more noticeable at resonance, since at lower frequencies the inductor 50 becomes essentially negligible. It is clear therefore that for low frequency operation when the feedback path has a high impedance, as well as for high frequency operation when the feedback path has a low impedance, no neutralization is necessary from the plate 51 to the grid 32 of the driving amplifier triode section 33. For high frequency operation the series resonant circuit including inductor 50 and capacitor 83 provides a much lower than usual signal potential across the anode to ground signal impedance and therefore does not require neutralization even though the plate-to-grid interelectrode capacity of the driving amplifier section 33 becomes a much smaller impedance for the signal frequencies.

Figure 6:
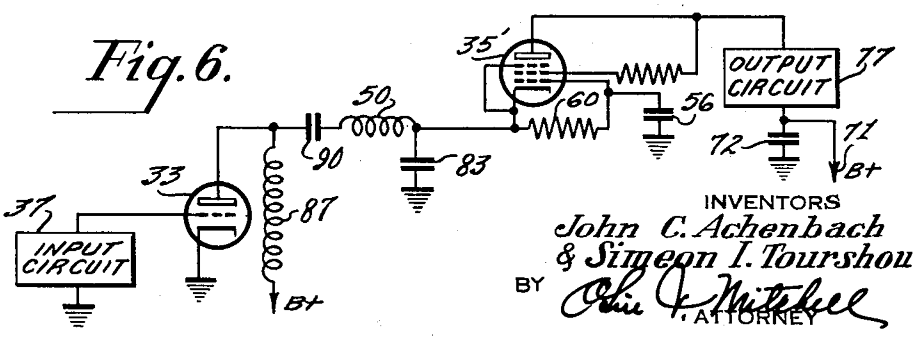

Should it be desirable to provide separate direct current discharge paths for the driving amplifier section 33 and the driven amplifier 35 a circuit as shown in Figure 6 may be provided. In this embodiment the driving amplifier 33 need not be balanced with the driven amplifier section 35 as to the direct current impedances, or voltage drop across each tube. Therefore a pentode amplifier may be used if desired. In general, the high frequency amplifying system need not be limited to triodes, if the advantages of better signal-to-noise operation are not important.

The series resonant coupling circuit 50 and 83 operates in a manner similar to those hereinbefore described. As in Figure 5, the inductor 87 may be made to parallel resonate with the capacitor 83 for lower frequency signals to provide increased gain over an even more extended frequency range, than otherwise possible with the more simplified embodiments of the high frequency amplifying system.

Figure 7:
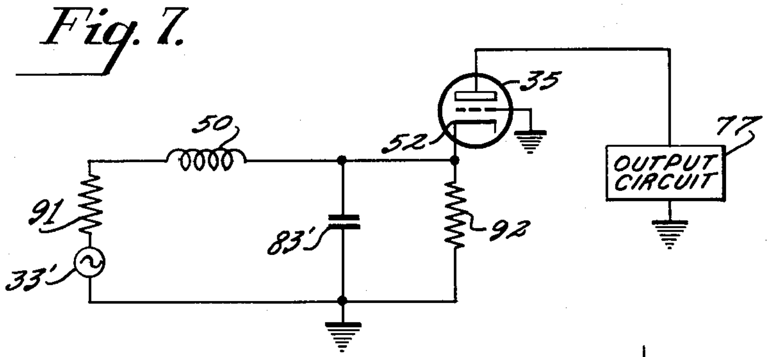
Figure 7 is an equivalent schematic diagram of the interstage coupling circuit of the amplifier circuits embodying the invention.

Figure 7 is an equivalent circuit illustrating the coupling circuit between a driving source 33′ and a grounded-grid cathode-input amplifier stage 35. The coupling is constituted by the inductor 50 and the capacitor 83′. Capacitor 83′ may be considered the combined capacity of the fixed, interelectrode and stray capacity between the cathode 52 and ground. Resistor 91 is considered the internal impedance of the input tube or other driving source 33′. Resistor 92 exemplifies the input resistance of the triode amplifier tube 35. This input resistance is low enough to provide a wide bandpass coupling circuit which works entirely satisfactorily across the frequency range of about 170 to 220 megacycles now covered by television channels 7 through 13, when the inductor 50 is in the order of .15 micro-henrys and the capacitor 83′ is in the order of 5 micro-microfarads.

Totem or series-connected amplifiers having only grid-leak bias for the highest potential amplifier stage or second unit present a problem in providing the desired grid voltage vs. plate current characteristic when control bias such as supplied by an A. G. C. system is applied to the grid of control electrode of the lower potential stage or first unit. The anode voltage of the first unit is a function of the ratio of the plate resistances, $r_{p1}$ and $r_{p2}$ of the two units, and since $r_{p1}$ (plate resistance of the first unit) will increase as bias is applied to the first grid, while $r_{p2}$ remains essentially constant, the anode voltage of the first unit will rise. This rising anode voltage tends to maintain an appreciable anode current for quite high values of grid bias, which results in a remote cut-off characteristic such as shown by curve A of Figure 8. As before mentioned, difficulty may be encountered in providing sufficient bias from the A. G. C. system for proper operation. Thus, a semi-remote characteristic shown by curve C would in general be more desirable, particularly in radio frequency amplifiers.

Figure 9:
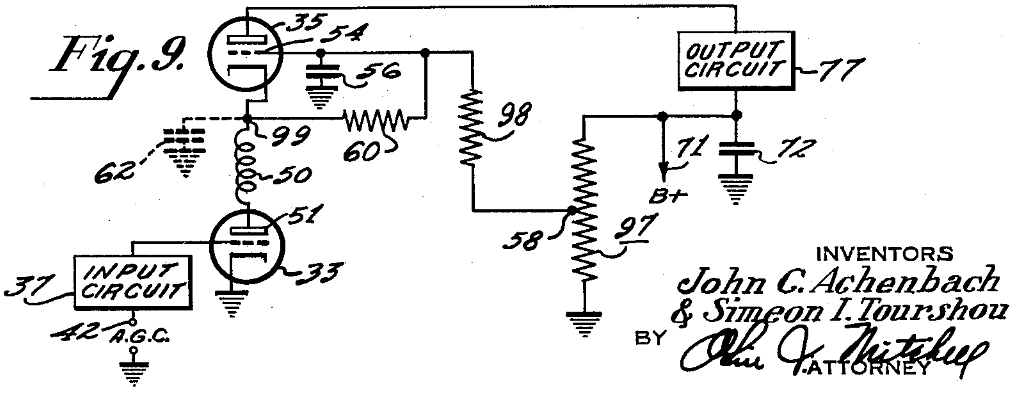

In accordance with the invention, there is shown in Figure 9 schematically a circuit for providing modified remote cutoff characteristics, such as shown in curve C, for a pair of series connected tubes having common anode current paths. In this circuit, bias for the grid 54 of the driven amplifier section 35 is provided from a voltage dividing network 97 connected from the B+ terminal 71 to ground. The voltage provided at the tap 58 is essentially half the B+ supply voltage and is in the order of that provided at the anode 51 of the driving amplifier section 33 when the tube impedances are balanced. Connected from the tap 58 to the common direct current connections between the two tube sections 33 and 35 is a further voltage dividing network comprising the two resistors 98 and 60. The entire voltage dividing network includes the direct current discharge path of the driving tube. Section 33 and the grid leak resistor 60, whereby variations of voltage drop across the driving tube section 33 are effective to cause a difference of direct current bias on the grid 54 of the driven tube section 35. Variations of voltage drop like those in the driving tube section 33 will thereby be effected in the driven tube section 35 to provide modified cut-off characteristics. This is caused because the bias on the driven tube section 35 automatically increases as the bias on the driving tube section 33 is increased, at a rate determined by the positive potential source and the ratio of the voltage dividing network portion connected between the grid and cathode of the driven tube section 35 to the voltage drop across the discharge path of the driving tube section 33.

The resistor 98 is very large as compared with the resistor 60, say of the order of 10 megohms to 500,000 ohms. Accordingly, there will be a potential at the grid 54 of about zero when the tube sections 33 and 35 both have the same internal impedance and are balanced in operation. When the automatic gain control voltage at terminal 42, or the initial unbalance of the tubes used, changes the impedance of the driving amplifier section 33 with respect to that of the driven amplifier section 35 however, a potential difference will occur between the points 99 and 58. The portion of this potential appearing across resistor 60 will provide bias at the grid 54 of the proper polarity to cause the impedance of the driven amplifier tube section 35 to approach that of the driving amplifier section 33.

Figure 8:
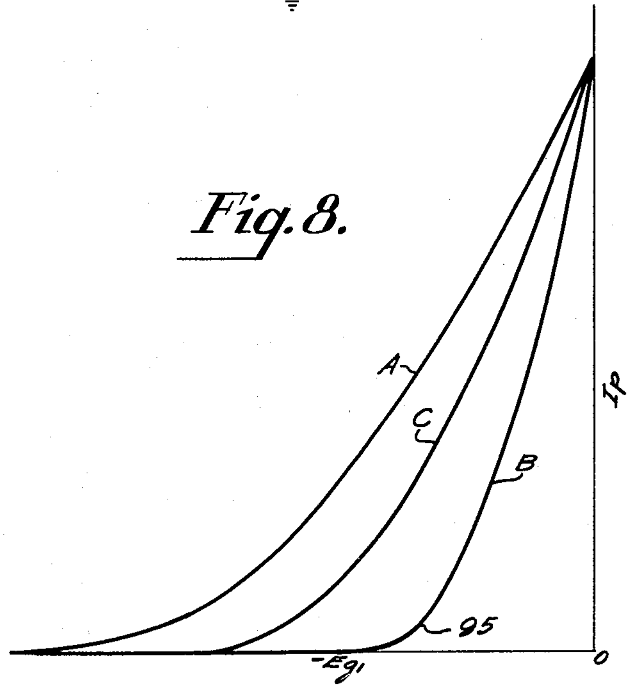
Figure 8 is a graph illustrating certain features of operation of the invention; and, Figure 9 is a further modification of a wide band amplifier embodying the invention.

This circuit therefore keeps the anode voltage of the first section more nearly constant over wide ranges of gain control, and in effect provides the desired modified remote cut-off characteristics shown by the curve C of Figure 8.

If the resistor 98 were considerably lower in value, the anode voltage of the first section would be held more nearly constant and the cut-off characteristic would approach that shown in curve B of Figure 8. However, the sharp departure from linearity in region 95 of this curve would give rise to strong cross modulation components. Also, the bias resistor network tap 58 would have to be adjusted for each individual tube used in this circuit in order to realize the maximum gain and best signal-to-noise performance. A high value of resistor 98 allows considerable tolerance in the location of tap 58 without deteriorating the performance appreciably.

The present invention therefore has coordinated the tube elements and circuit connections of series-connected amplifiers to produce a resultant amplifier which has high gain and good signal-to-noise characteristics. Accordingly a circuit combination has resulted with fewer component parts, yet affording improved performance in the exacting field of broad band amplification.

What is claimed is:

In a signal amplifying system, the combination comprising first and second electron tubes each having at least an anode, a cathode and a control grid, means connecting the cathode of said first tube to ground, an anode potential terminal connected with the anode of said second tube, means connecting the anode current paths of said tubes in series between ground and said anode potential terminal comprising a direct current circuit connected between the anode of the first tube and the cathode of the second tube, an automatic gain control voltage terminal connected to the control grid of the first of said tubes, a voltage divider network including a first and second resistors connected in series between ground and said anode potential terminal for supplying a biasing potential for the second tube at the junction of said first and second resistors, circuit means including a third resistor providing a direct current connection between the control grid of said second tube and the junction of said first and second resistors, and direct current conductive means for providing balanced tube impedances and a less remote cut-off characteristic for said signal amplifying system than otherwise would be present including a fourth resistor connected between the control grid of the second tube and the direct current circuit connected between the anode of said first tube and the cathode of said second tube.

References Cited in the file of this patent

UNITED STATES PATENTS

| | | |
|---|---|---|
| 1,986,597 | Nyman | Jan. 1, 1935 |
| 2,138,891 | Soller | Dec. 6, 1938 |
| 2,241,892 | Strong | May 13, 1941 |
| 2,326,614 | Bowman | Aug. 10, 1943 |
| 2,474,435 | Moore | June 28, 1949 |
| 2,525,632 | Anderson | Oct. 10, 1950 |
| 2,592,193 | Saunders | Apr. 8, 1952 |

OTHER REFERENCES

Artzt: "Survey of D. C. Amplifiers," page 6, RCA Laboratories. Reprint from August, 1945 issue of Electronics.

RCA Review, article by Cohen, March 1951, page 19.